United States Patent [19]
Gore et al.

[11] Patent Number: 5,369,551
[45] Date of Patent: Nov. 29, 1994

[54] SURFACE MOUNT STRESS RELIEF INTERFACE SYSTEM AND METHOD

[75] Inventors: John G. Gore, Mt. Dora; Neal J. Tolar, Longwood, both of Fla.

[73] Assignee: Sawtek, Inc., Orlando, Fla.

[21] Appl. No.: 148,292

[22] Filed: Nov. 8, 1993

[51] Int. Cl.[5] .............................................. H05K 1/00
[52] U.S. Cl. ................................... 361/767; 361/760; 361/768; 361/86; 174/35 R; 174/261; 439/91; 439/65; 439/88
[58] Field of Search .............. 361/760, 767, 768, 770, 361/777, 808, 816; 174/261, 35 R; 439/44, 65, 67, 68, 70, 74, 88, 91

[56] References Cited

U.S. PATENT DOCUMENTS

| | | | |
|---|---|---|---|
| 3,588,616 | 6/1971 | Palazzini | 317/101 |
| 4,357,647 | 11/1992 | Hadersbeck | 361/400 |
| 4,895,524 | 1/1990 | Thepault | 439/74 |
| 5,155,905 | 11/1992 | Miller, Jr. | 29/843 |

Primary Examiner—Leo P. Picard
Assistant Examiner—L. Thomas
Attorney, Agent, or Firm—Allen, Dyer, Doppelt, Franjola & Milbrath

[57] ABSTRACT

An interface printed circuit board is configured to be placed between a leadless component such as a surface mount package used to house a SAW device and a standard printed circuit board configured for solder joints in a leadless contact with the printed circuit board. The interface device is made using materials having similar characteristic thermal expansion properties as that of the printed circuit to with it is affixed. Solder pads are placed in offset pairs and interface board material is removed such that the combination causes the interface board to flex from the forces caused by the differing expansion coefficients of the solder, the package and the printed circuit boards. The configuration causes the relative movement between the leadless carrier and the printed circuit board to occur along a length of epoxy and glass board material by bending the epoxy and glass as opposed to applying tensional or compressive forces to the solder joints. Such an approach relieves the stress and resulting creep seen at solder joints in the typical solder joint or column. In addition, by segregating the input and output pads and placing a metal shield between them, crosstalk rejection of the components is improved.

19 Claims, 4 Drawing Sheets

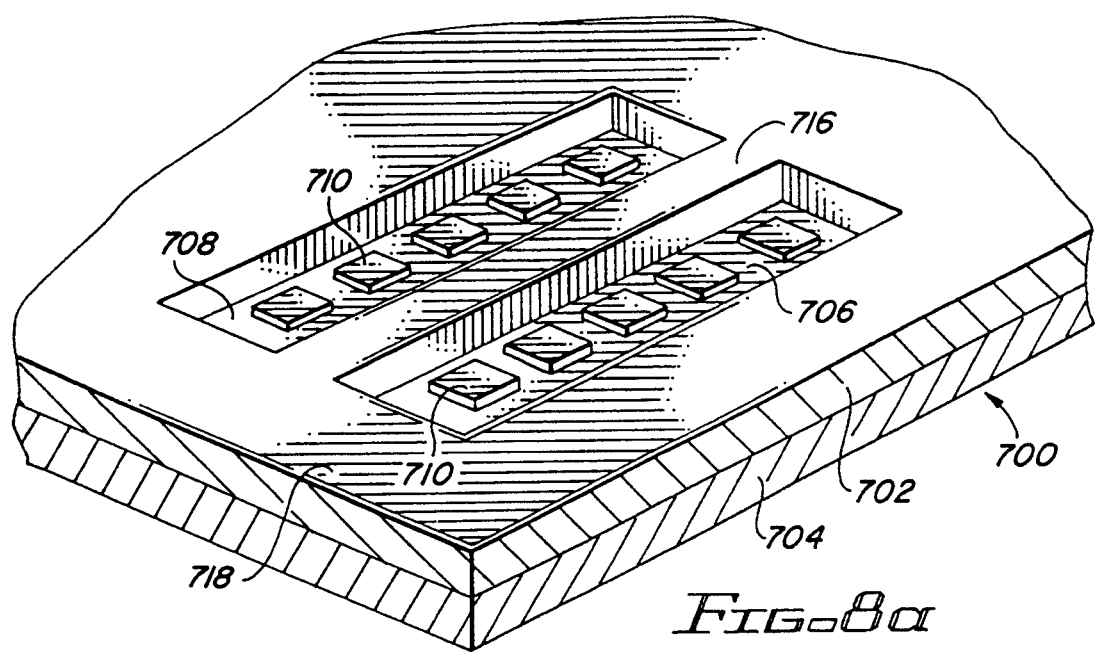
FIG_8a
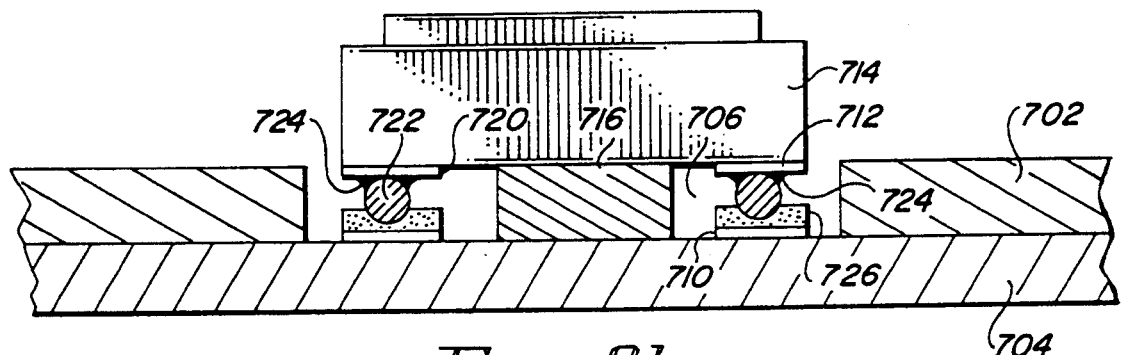
FIG_8b
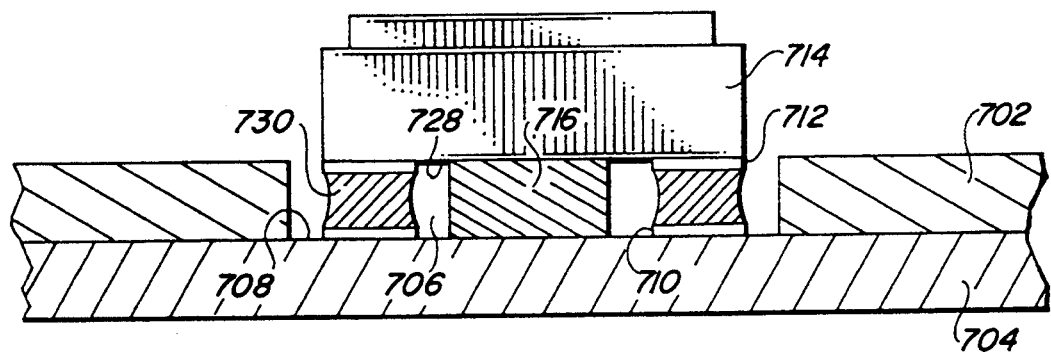
FIG_8c

SURFACE MOUNT STRESS RELIEF INTERFACE SYSTEM AND METHOD

BACKGROUND OF THE INVENTION

1. Field of the Invention

This invention relates to surface mount technology using leadless integrated electronic circuit components and in particular to systems and methods for minimizing stress between the leadless component and the printed circuit (PC) board.

2. Description of Background Art

Surface mount technology offers several advantages for electronic equipment manufacturers including the critical advantage of increased component packing density. One of the biggest demands for surface mount technology in the surface acoustic wave (SAW) device industry comes from the cellular and cordless telephone market. The "cigarette pack" is being replaced by the "telephone pack". For the electronic equipment manufacturer, surface mount technology carries with it a difficult solder joint thermal mismatch problem between the component or surface mount package and the PC board. The thermal mismatch problems are especially acute for low frequency and narrow bandwidth SAW devices where the package size can be relatively large. These problems then rule out off-the-shelf options and therefore confront the SAW manufacturer with high package tooling costs.

The coefficient of thermal expansion (CTE) is a number that represents the dimensional change of a material over a specific temperature range. By way of example, a well accepted mounting arrangement for mounting a surface mount package (SMP) which is carrying a SAW device is to solder the ceramic bases onto a copper clad PC board material using a lead and tin alloy solder paste. The thermal profile during solder paste reflow typically exceeds 200° C. for short periods of time. The CTE of the epoxy and glass PC board material is approximately three times greater than the ceramic material used in the package and occasionally less than half the CTE of the solder alloy that joins the two. Effects of the thermal mismatch are first encountered during the cool down period after the solder is reflowed during initial attachment. The molten solder will solidify just below 200° C. and at that time the assembly is mechanically fixed and as near stress free as possible. As the temperature continues to decrease, the differing expansion rates begin to become a factor. The PC board material decreases in size at a ratio of about three to one with respect to the SMP ceramic substrate. The solder alloy decreases by as much as two to one relative to the PC board and six to one relative to the ceramic. As the relative locational association of the solder pads on the ceramic and PC board begins to change, mechanical stress increases in all three components (the ceramic, the PC board, and the solder joint). The solder joint is usually the weakest of the three and as a result breakage occurs in the joints at various stress points depending on the specific alloy being used.

One factor that complicates the identification of over stressed joints is that the joints are most likely to degrade but not completely fail. In other words, they may remain electrically active for some period of time and then experience failure. While the first cool down period after reflow begins the process of mechanically degrading the solder joint, the joints are most likely to fail after some number of thermal cycles during the normal life environment. Another situation includes the intermittent electrical failure of the solder joint. The indication is that a particular joint functions normally and displays no problems except for this intermittent open indication that may exist for very short periods during some portion of the thermal cycle. The relative movement created by the CTE mismatch is sufficient to move a break in the solder joint into and out of electrical contact. Such failures are difficult to detect and require more extensive testing including greater attention to the temperature cycles used and continuous monitoring during the cycles.

As discussed, more and more demands are being made for providing compact instruments such as the cellular telephone that fits in the breast pocket. Leadless packages are therefore very desirable for meeting the size efficiency demands. Leaded components (as in electrical lead) relieve the stress problems but take up valuable "real estate" in doing so. Leadless chip carriers offer attractive size efficiency but suffer thermal mismatch and crosstalk problems. Several options are available to the industry that meet many of the requirements. Packages are supplied with either flat leads or simple terminations. Leads may exit from the sides of the package and transition to the board level as in "gull-winged" and "J-lead" designs. Alternatively, the may exit from the bottom and either be flat or tuck underneath the package as in the "C-lead" configuration. The gull-wing or flat approaches are simple but waste precious PC board area. The J-lead and C-lead raise the base further off the PC board than alternative techniques, resulting in not only increased volume requirements for a device but higher crosstalk and lead inductance.

It is also well known in the art to increase the height of the solder column between the package terminal pad and PC board terminal pad. Increasing the height of a column with a fixed SMP footprint spreads the total stress over a greater mass and ultimately decreases the stress per unit mass. The column deals with the relative pad movement by bending as opposed to shearing. Since the stress levels per unit mass can be maintained at a level that does not cause creep to occur, the joint will survive thermal cycles. Although this approach is simple in concept, there are problems in the implementation of such a mounting scheme. Foremost is the difficulty in increasing solder column height for a given footprint using standard production assembly techniques. By way of example, many factors must be considered including the solder alloy used, special tooling and fixturing to elevate the SMP during reflow, and cleaning and inspection problems that result from the use of non-removable spacers between the part and the PC board.

U.S. Pat. No. 4,847,136 issued to Ching-Ping Lo on Jul. 11, 1993 discloses a thermal expansion mismatch forgivable printed wiring board for a ceramic leadless chip carrier. A PC board is fabricated wherein a thin expansion layer is provided on top of what would be considered a conventional PC board. This expansion layer is bonded to the PC board except at locations underneath the footprint of the chip carrier and solder joints. This expansion layer reduces the stress of the solder joints between the ceramic leadless chip carrier and the PC board due to thermal expansion mismatch, thus reducing the cracking of the solder joint. As is well known in the art, metal plates are added as part of the PC board where it is desirable to thermally conduct heat away from the PC board and where added strength is required. U.S. Pat. No. 4,658,332 issued to Thomas E. Baker et al. on Apr. 14, 1987 teaches a compliant layer PC board.

U.S. Pat. No. 4,641,222 issued to Dennis J. Derfiny et al. on Feb. 3, 1987 discloses a mounting system for stress relief in surface mounted components. The PC board is conditioned by removing selected areas of media surrounding the points of attachment between the surface mounted component and the PC media. In addition, a spacing element is disposed between the surface mounted component and the PC board to promote the formation of a virtual lead during assembly. U.S. Pat. No. 4,654,248 issued to Juzer Mohammed on Mar. 31, 1987 teaches a PC board with zones of controlled thermal coefficient of expansion.

U.S. Pat. No. 4,554,575 issued to Michael R. Lucas on Nov. 19, 1985 teaches a low stress leadless chip carrier and method for assembly to a PC board. A plurality of castellations are provided in the perimeter walls of the carrier member and solder preforms are deformably fitted in the castellations for reflow vapor phase soldering to a PC board. A spacer member is disposed between the carrier member and the printed circuit board and has a CTE matched to that of the solder. The spacer includes a high thermal conductivity planar metal portion sandwiched between an adhesive epoxy layer which facilitates assembly of the carrier to the PC board.

While there has been an effort to solve solder joint stress failures caused by thermal mismatch, the need to provide an effective packaging method that meets the needs for simple fabrication having reduced joint failure due to thermal stress problems and reduced crosstalk has not been provided.

SUMMARY OF INVENTION

The invention discloses an interface device useful with leadless electrical connections of components having different coefficients of thermal expansion. The device comprises an interface board having a first surface and an opposing second surface. The first surface is dimensioned to receive a surface mount package (SMP) having a plurality of electrical contact pads. The second surface is dimensioned to be affixed to a printed circuit board. The interface board comprises a plurality of board sections void of structure. In the preferred embodiment, the interface board has a coefficient of thermal expansion approximately equal to that of the printed circuit board to which it is affixed. A first leadless contact means is affixed to the first surface and is arranged to cooperate with corresponding pads from the surface mount package. A second contact means is affixed to the second surface and arranged to cooperate with corresponding pads on the printed circuit board. The first contact means is laterally displaced from the second contact means by a distance sufficient to allow for movement between the first and second contact means wherein the movement is a result of temperature effects. Means for electrical connection of the first and second contact means is provided and is integrally affixed to the interface along a path on the first and or second surface from the first contact means to a location opposed to the second contact means wherein the connection means penetrates the interface board for making electrical contact with the second contact means. The path is configured between the structural voids. The structural voids permit the interface board containing the electrical connection means to be compliant during the movement between the first and second connection means.

In an alternate embodiment, the interface board further comprises an input portion wherein the contact means are used for component input signals, an output portion wherein the contact are used for component output signals, and a central ground portion. The central ground portion comprises means for electrically shielding the input portion from the output portion, and as a result reduces crosstalk between the input and output signals.

In another alternate embodiment, the stress relief interface device is configured with a surface mount package having a central section comprising a plurality of ground pads, an input section comprising a plurality of input pads, and an output section comprising a plurality of output pads. The input and output sections are separated by the ground section. An interface printed circuit board having a first surface and a second surface, and a center section is disclosed having a plurality of arm-like peninsular sections extending from the center section. The arm-like sections have their proximal ends integrally affixed to the center section and their distal ends positioned for receiving a surface mount package pad. The arm-like sections are configured so as to provide a compliant movement between the proximal and distal ends from a force on the distal end within the plane of the interface board and radially out from the board center section. First interface pads are structurally affixed to the arm-like distal ends. Each of the first interface pads is electrically affixed to a corresponding input, output and ground package pad. Second interface pads are structurally affixed to the board second surface at the arm-like proximal ends. The second interface pads are positioned for connection to corresponding input, output and ground pads of a printed circuit board. Each of the plurality of first and second interface pads forms a plurality of interface pad sets. Conduction means are affixed between each of the first and second pads. The connection means provide electrical contact between each pad cooperating with a surface mount package pad and a corresponding pad on the printed circuit board. The connection means is integrally affixed to each arm-like section comprising the first and second pad set.

A method is disclosed for providing stress relief to solder joints used for affixing leadless surface mount packages to printed circuit boards. The method comprises the steps of providing an interface printed circuit board having a first surface and an opposing second surface, providing a plurality of first electrical contact pads, aligning the first contact pads for receiving the contact pads of the surface mount package with which it is communicating, affixing the first contact pads to the first surface having and aligning the pads for receiving the contact pads of a surface mount package with which it is communicating, providing second contact pads, affixing the second pads onto the second surface, aligning the second contact pads for electrical contact with corresponding pads of a printed circuit board with which it is communicating, displacing the first contact pad from each corresponding second contact pad by a length of interface board sufficient for flexing during movement between the first and second pads, the movement being caused by differing thermal expansion between the surface mount package and the interface board, electrically connecting the first and second pads, and forming arm-like sections extending from the center surface area of the board by removing board sections on both sides of a path between the first contact pad and the second contact pad, the displacement between the first and second pads and the removing of board sections providing stress relief to the corresponding solder joints affixing the first contact pads to the surface mount package pad and the solder joints of the second contact pads to the printed circuit board pad.

In an alternate method providing an input, output and ground sections for the interface board, contact pads are selected for use as groups of input, output and ground pads. By separating the input and output pad groups by the ground pad group and providing an electrical shield within the ground section of the board, the shield acts to reduce crosstalk between input and output signals.

It is a primary object of the invention to provide a method and device that is incorporated into the mounting process of a surface mount package to a printed circuit board whereby stress within the solder joints caused by differing coefficients of thermal expansion between the surface mount packages, solder and printed circuit board components is reduced. It is another object of the invention to provide means for improving crosstalk rejection between the input and output terminals of such leadless components. It is yet another objective of the invention to provide such crosstalk rejection and reduced solder joint stress while at the same time reducing the need for need for increased board area and packaging heights. The surface mount stress relief interface printed circuit board disclosed herein meets the objectives by providing a device so configured that the relative movement between a leadless chip carrier such as an SMP and the printed circuit board to which the SMP is affixed occurs along a length of the epoxy and glass printed circuit board by flexing the interface board as opposed to permitting tensional or compressional forces to be applied to the solder joints. The device disclosed eliminates the damaging stresses within the solder joint and thereby eliminates the creep in the solder joint that causes ultimate joint failure.

BRIEF DESCRIPTION OF DRAWINGS

A preferred embodiment of the invention as well as alternate embodiments are described by way of example with reference to the accompanying drawings in which:

FIG. 8a is a partial perspective view of a two layer printed circuit board having cavities in a top layer, the cavities exposing solder pads affixed to a bottom layer of the printed circuit board;

FIG. 8b is a partial cross sectional view of an SMP resting on a top surface of a top layer of a printed circuit board wherein high temperature solder balls are positioned for a reflow process; and FIG. 8c is a partial cross sectional view of a completed assembly of the SMP pads affixed to pads on the printed circuit board using a solder column.

DETAILED DESCRIPTION OF PREFERRED EMBODIMENT

Figure 1:
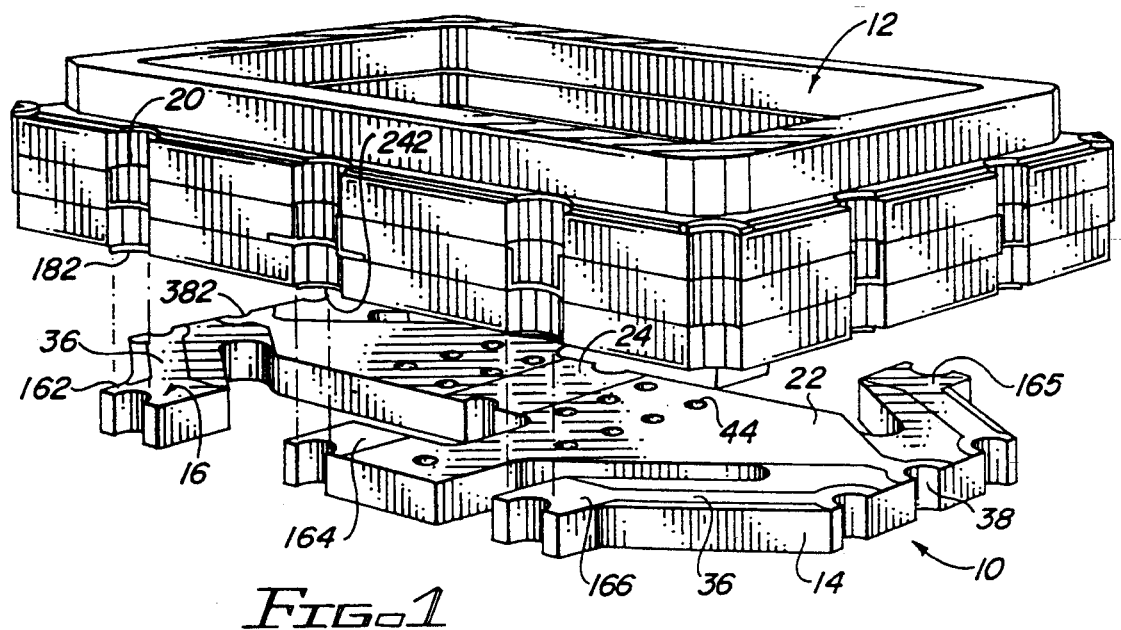
FIG. 1 is a perspective view of the stress relief interface printed circuit board in an exploded arrangement with a perspective view of a surface mount package, the angle of view is such that a first surface for interfacing with a SMP or the like is shown, the package is shown without its leadless component and without its hermetically sealed package top.

A preferred embodiment of the stress relief interface PC board 10 is shown by way of example for use with a surface mount package 12 in FIG. 1. The preferred embodiment of the device 10 comprises a PC board base structure 14 made from FR-4 epoxy and glass laminate. Other relatively compliant PC board materials well known in the art can also be used. The interface board 10 is configured to be placed between a surface mount package 12 and a printed circuit board (not shown).

Figure 2:
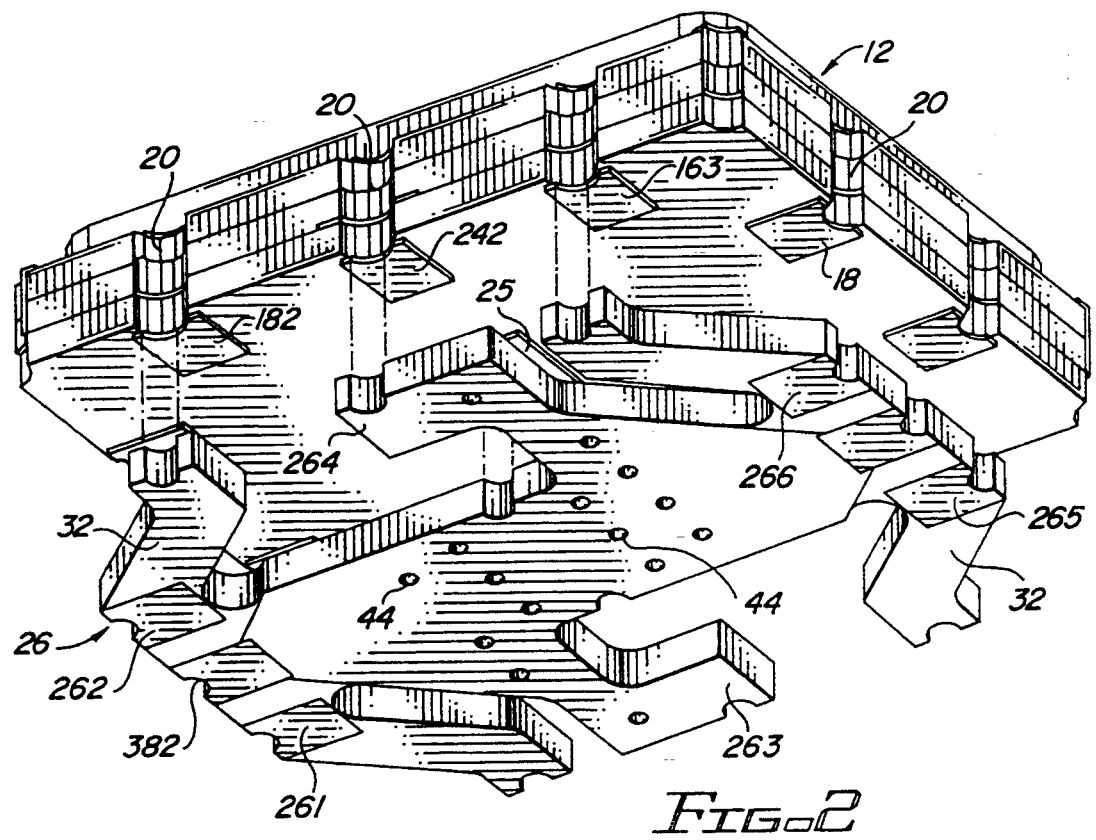
FIG. 2 is a perspective view of the stress relief interface printed circuit board in an exploded arrangement with a perspective view of a surface mount package, the angle of view is such that a second surface for interfacing with a printed circuit board is shown, the base side of the SMP is shown with its multiple solder pads and castellations.

In the preferred embodiment illustrated here by way of example, interface PC board 10 includes electrical contact or solder pads 16 which are sized and positioned to fit the footprint of the SMP solder pads 18. As illustrated in FIG. 2, a perspective view of the stress relief interface printed circuit board 10 in an exploded arrangement is shown with a perspective view of the surface mount package 12. The angle of view is such that the surface of the board 10 for interfacing with a printed circuit board is shown. The base side of the SMP 12 which contacts the board 10 is shown with its multiple solder pads 18 and castellations 20.

Figure 3:
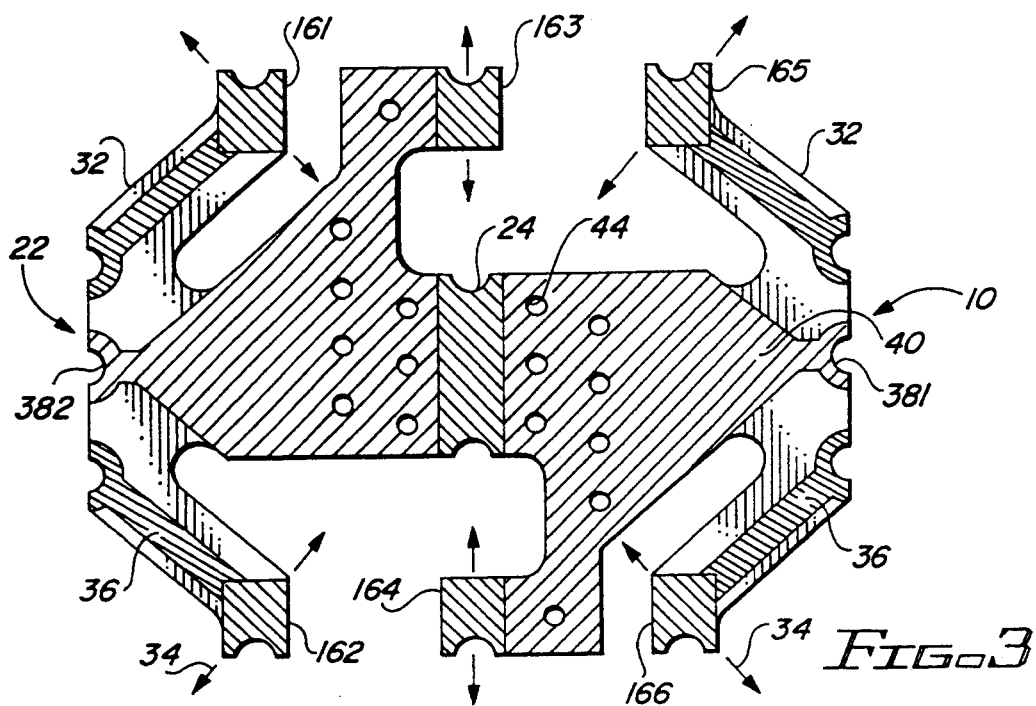
FIG. 3 is a plan view of the preferred embodiment first surface of the interface printed circuit board illustrating the segregation of the solder pads based on input, ground and output signals and the electromagnetic shielding plate configuration between the input and output pads, arrows illustrating the movement of pads due to thermal expansion effects are shown.

The placement of the first set of solder pads 16 on the first surface 22 of the interface board 10 is such that each active SMP pad 18 has a corresponding interface pad 16. In the illustration as presented in FIG. 1, the SMP 12 has ten peripheral pads 18 and a central ground pad 24 which is more clearly illustrated in FIG. 3 illustrating by way of a plan view of the preferred embodiment first surface 22 of the interface printed circuit board 10. FIG. 3 also illustrates the segregation of the solder pads 16 based on input pads 161 and 162, ground pads 24, 163, and 164, and output signal pads 166 and 165. Of the peripheral pads 18 shown in the SMP 12 of FIG. 2, only seven pads are required for the intended SAW device (not shown) but it is expected that those of ordinary skill in the art will see that an interface board 10 can be configured to use the precise amount of required pads 16 or with extra pads so that a variety of components can be used within the SMP 12 without using a special interface board for each component. The active pads 18 of the SMP 12 for the example shown are two output pads 182 (second not shown), two peripheral ground pads 242 (second not shown), the center ground pad 24, and two input pads 161 and 162. These pads can best be seen by viewing FIGS. 1 and 3. For each of these active SMP pads 18, there is a corresponding interface pad 16, the two input pads 161 and 162, two peripheral ground pads 163 and 164, two output pads 165 and 166, and a center ground pad 24. These corresponding pads are aligned when the SMP 12 is affixed to the interface board 10 through soldering processes such as reflow well known in the art of leadless component soldering.

In the preferred embodiment, the solder pads on the interface board 10 are solder tinned copper. Typically the SMP 12 solder pads are fabricated from a gold pleated refractory metal. The interface printed circuit board as discussed earlier is constructed from FR-4 epoxy and glass laminate having a characteristic coefficient of thermal expansion ranging from 16 to 24 ppm/C. These preferred embodiment materials were selected for use with a surface mount package 12 constructed from an alumina having a characteristic coefficient of thermal expansion of approximately 3 to 5 ppm/C. The printed circuit board not shown but used in the thermal testing for the interface device 10 and in the completed product device is also made from an FR-4 laminate.

Figure 5:
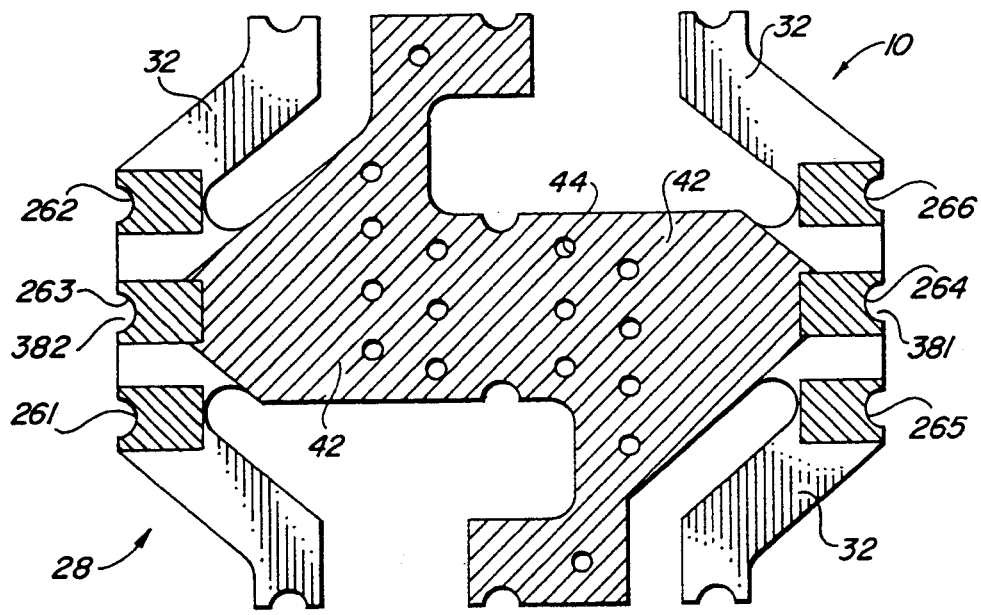
FIG. 5 is a plan view of the preferred embodiment second surface of the interface board illustrating the arrangement of the pads and ground shield for the PC board interfacing side.

With reference again to FIG. 2, a second set of pads 26 is affixed to the second surface 28 of the interface board 10. There is a corresponding pad 26 for each of the first surface pads 16. By way of example with the embodiment using the illustrated SAW device configuration, and as illustrated in FIGS. 1 and 2, interface input pads 161 and 162 will have a corresponding second surface input pads 261 and 262. Similarly for peripheral ground pads 163 and 164, there are corresponding peripheral second surface ground pads 263 and 264, and likewise second surface output pads 265 and 266 to correspond to first surface input pads 165 and 166. Unlike the aligned relationship between the peripheral SMP pads 18 and the first surface pads 16, the second surface pads 26 are laterally displaced from their corresponding first surface pads 16 as can be seen when comparing the illustrations of the top view and bottom view of the board 10 as illustrated in FIGS. 3 and 5. FIG. 5 shows a plan view of the preferred embodiment second surface 28 of the interface board 10 illustrating the arrangement of the pads for interfacing with a PC board (not shown). The interface board pads 16 as illustrated are located on the perimeter of the interface board 10 in such a manner that each is located at the extremity of an arm member 32, the arm member 32 formed by the removal of board material 14 along a path on the arm member 32 between the peripheral pad 16 and its cooperating second surface pad 26. It is this displacement between cooperating pads and the increased flexibility of the board structure 14 by virtue of the peninsular shaped arm member 32 that allows the epoxy and glass laminate to flex from thermal expansion forces as a result of the differing coefficients of thermal expansion. By way of further example with the demonstrated embodiment, and again with reference to FIG. 3, a concept of the invention is illustrated with a polar array or arrows 34 indicating the direction of movement of the perimeter pads 16 caused by the expansion of the material as a function of temperature increases and decreases. The movement 34 radially in and out is relative to a stationary point in the center of the central ground pad 24. The central ground pad 24 is affixed to a central pad 25 of the SMP 12. Keeping in mind that if the coefficient of thermal expansion for the "x", "y" and "z" components of a material are equal, the change in size due to temperature effects is constant throughout the molecular structure. Therefore if the centroid of a piece of material is understood to be stationary, the size change relative to the centroid will be uniform throughout the material and will be either away from or toward the centroid depending on whether the temperature is increasing or decreasing and whether the material has a positive or negative coefficient of thermal expansion. The forces required to displace the perimeter pads 16 located at the ends of peninsular arm members 32 has been measured and been found to be orders of magnitude less than the force required to cause any degradation to a solder joint. This is where the movement occurs rather than in the solder joint as is the typical case where the joint undergoes the stress and resulting creep. Because the laminate flexes, the integrity of the solder joint is maintained as the components are sent through their cyclical thermal gradients.

Figure 4:
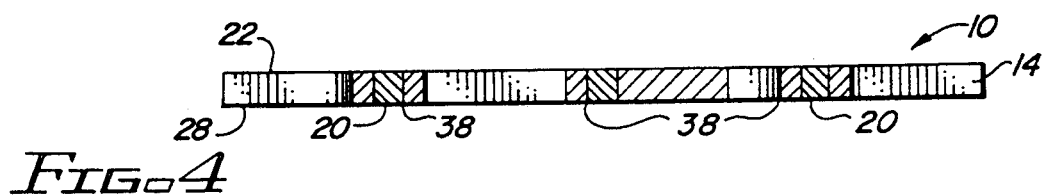
FIG. 4 is a side view of the embodiment of FIG. 3 illustrating the vertical castellations which provide a contact between the first surface and second surface of the interface board.

Again with reference to FIG. 3, each of the six pads (161 through 166) located on the perimeter of the interface PC board 10 are located at the end of a peninsular arm member 32. A circuit board conductive trace 36 connects each of these pads 16 to a semicircular vertical trace referred to as a castellation 381 and 382 that then connects to the cooperating solder pads 26 located on the second surface 28 of the interface board 10 as is illustrated in the side view of the board 10 in FIG. 4 and in the perspective views of FIG. 1 and FIG. 2. The solder pads 26 are used for the solder connection to the printed circuit board used for the electronic product being assembled. These castellations 38 form a 180 or half cylinder shaped conductive paths (illustrated in the views of FIG. 3 and FIG. 4) that are located on the outer edge of the interface PC board 10. These castellations 38 make the electrical connection between the first surface traces 36 and second surface pads 26 as described and in addition, once brought together for assembly, allow solder to wick up into the castellation 38 from the pad 26 during reflow and ease the task of visual inspection of a solder joint after reflow. Standard conductive feed throughs are also used for the purposes of making the electrical connection between surfaces of the interface board 10.

To re-emphasize for the case of the interface printed circuit board 10, the expansion will be radially outward from the center area of the board where the center ground pad 24 is affixed. It can be seen therefore that these radial forces will move the first surface peripheral pads 16 so as to create a flexing or compliant moment arm with their corresponding second surface pads 26. This compliant arm member 32 between each of the first and second surface pad pairs provides the stress relief to the solder joints by taking the movement over the moment arm rather than all within a solder joint of the known solder column. The arrows 34 shown in FIG. 3 illustrate this stress relief movement path of the compliant arm member. The ideal interface board 10 will have moment arms 32 that are displaced radially outward from the center of the board 10. As surface mount packaging evolves to meet extreme thermal cycles, it is anticipated that such SMP packages will focus on such expansion phenomenon and ideal interface designs will also evolve. In the meantime, when the demands on packaging come primarily from those leadless devices now in the marketplace, the preferred embodiment has been proven to be the best mode for the invention as disclosed.

At this point in the detailed description, it is of interest to present alternate methods and devices used in solving the stress relief problems associated with leadless devices. These devices are illustrated in FIGS. 6, 7 and 8.

Figure 6:
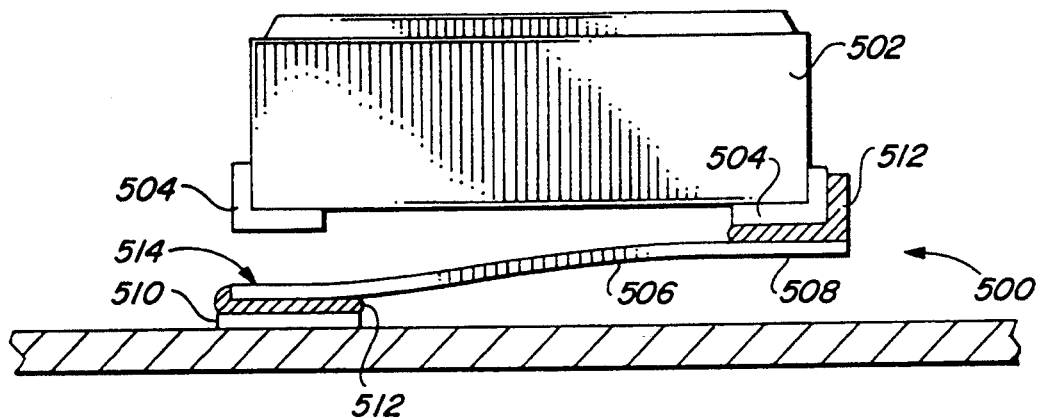
FIG. 6 is a partial side view of a surface mount package using a hidden lead device to affix a pad of the surface mount package to a pad on a printed circuit board.

As illustrated in FIG. 6 showing a hidden lead device 500 an SMP 502 comprising SMP pads 504 are affixed to a flat hidden metal lead 506 at the lead end 508. Leads are attached to the SMP pads by a high temperature solder or a brazing technique that will not be affected by the temperature profile required to reflow lead tin paste. In the preferred embodiment the means for affixing the lead ends 514 to the PC board pad 510 is by use of tin solder 512 well known in the art. It is of value to note here that typical hidden lead thicknesses are of the order of 0.003 inches and once affixed between the PC board pad 510 and the SMP pad 504 allow the SMP 502 to be separated from the PC board by distances in the order of 0.005 inches. Such a hidden lead device 500 in the method of affixing the device 500 between the SMP 502 and PC board 516 solves the coefficient of thermal expansion mismatch between the SMP 502 and PC board 516 and in addition provides a minimum mounting height of the SMP 502 to the board 516. Reducing the mounting height saves valuable space in the typical configurations seen for devices using SMP technology. And in addition, the lead device 500 easily flexes to relieve joint stress during temperature excursions. The use of the hidden lead device 500 also provides for good cross talk suppression when the lead is used between a ground pad of the SMP 502 and the corresponding PC board ground pads 510. As a result, low mounting height of the SMP package is achievable that is not possible with other lead configurations.

Figure 7:
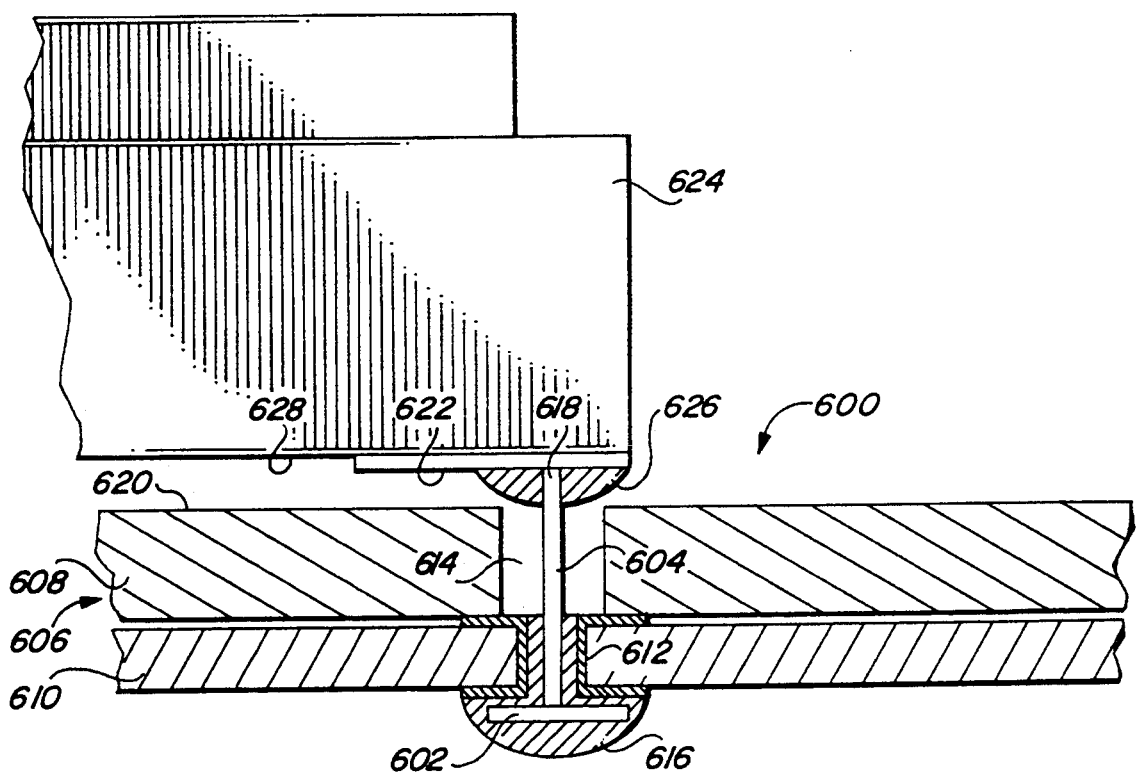
FIG. 7 is a partial cross sectional view of an inverted nail head pin penetrating a metallic feed through in a bottom layer of a printed circuit board, a pin post extending through a non-metallic feed through in a top layer of the printed circuit board and affixed using solder to an SMP pad.

Another method for resolving the coefficient of thermal expansion mismatch is seen in the inverted nail head stress relief pin illustrated in FIG. 7. The inverted nail head pin 600 comprises a head 602 to which a pin post 604 is integrally affixed. The inverted nail head pin 600 is used in combination with a printed circuit board 606 having a top layer 608 and a bottom layer 610. A PC board bottom layer 610 has a metallic feed through 612 for receiving the pin post 604. The PC board top layer 608 has a non-metallic feed through 614 cooperating with the metallic feed through 612 to receive the pin post 604. The head 602 and a portion of the pin post 604 passing through the metallic feature 612 is affixed to the metallic feed through by use of high temperature solder 616. The pin post 604 is of such a length that the pin top 618 extends above the PC board top layer top surface 620 in order to receive an SMP pad 622. An SMP 624 having the SMP pad 622 is affixed to the pin top 618 using a tin solder 626. By mounting the SMP 624 in this manner, a distance between the SMP bottom surface 628 and the PC board top layer surface 620 is typically of the order of 0.005 inches in the preferred configuration. The inverted nail head pin 600 thus provides a means of solving the coefficient of thermal expansion mismatch without the use of a specially designed package or SMP 624. The PC board 606 used would be constructed of the two layers 608 and 610 as described wherein the bottom layer 610 has metalized feed throughs and a top layer 608 has corresponding holes without metal 614. The pin 600 is inserted into the metallic feed through 612 and allowed to extend through non-metallic hole 614 to a point that would be about 0.005 inches above the top surface 620. The head of the pin 602 is then soldered with a high temperature solder 616 so that the joint between the head and the metallic feature 612 remain solid during a subsequent reflow of standard low temperature lead tin solder 626. Lead tin solder 626 would be screened on to the SMP 624 solder pads 622. The package 624 is placed on to the exposed pin tops and sent to a reflow oven to reflow the lead tin solder 626 not affecting the high temperature solder 616. In this way, the SMP 624 is attached to the PC board 606. Movement caused by coefficient of thermal expansion mismatch is absorbed by the exposed portion of the pin post 604 that passes through the non-metallic feed through 614 in the PC board top layer 608.

As illustrated in FIGS. 8a, b and c, a slotted PC board 700 is used to manage the coefficient of thermal expansion mismatch that occurs when a leadless ceramic chip carrier and a PC board have differing coefficients of thermal expansion. As illustrated in FIG. 8a, a two layer PC board having a top layer 702 and a bottom layer 704 are affixed. The top layer 702 has cavities 706 configured such that portions of the top surface 708 of the top layer 702 are exposed. Solder pads 710 are arranged on the top surface 708 of the bottom layer for receiving SMP pads 712 of an SMP 714. The SMP 714 is placed on the portion of the top layer between a pair of cavities 706. Such a portion 716 permits the SMP 714 to rest on a top surface 718 of the top layer 702 directly. The SMP pads 712 are suspended over the cavities 706 and above corresponding PC board solder pads 710. The PC board solder pads 710 have a border around the perimeter of the solder pads to allow room for a finished solder column to move unrestrained. The opening of the cavity 706 is such to enhance cleaning. As illustrated in FIG. 8b, an SMP 714 placed in a position such that the SMP pad 712 is above an appropriate PC board solder pad 710. A low temperature solder paste 720 is screened on to the SMP pads 712 first. Then a high temperature solder ball 722 is placed on each pad 712 into the paste 720. The SMP 714 then passes through a reflow oven that reflows the low temperature solder 724 but does not reflow the high temperature solder ball 722. This process attaches the high temperature solder ball 722 to the SMP pad 712 and completes the package preparation. In the preparation of the PC board 700, standard solder paste 726 normally a lead tin material is applied to the PC board solder pads 710 located within the cavities 706 on the top surface 708 of the PC bottom layer 704. The SMP 714 with the solder ball 722 now attached is placed on the PC board such that the solder ball 722 are inserted into the solder paste 726 located on the PC board pad 710. Such an assembly is now ready for reflow. Once passing through the reflow process, the completed assembly is as illustrated in FIG. 8c. The center portion of the SMP 714 lower surface 728 rests on the top surface portion 716 between the cavities 706. Solder columns 730 which are now a new alloy containing each of the three original alloys are significantly taller than standard solder joints and give the effect of a lead. Such a column will bend to relieve the stress that is caused by the coefficient of thermal expansion mismatch between the SMP 714 and the printed circuit board 700. As discussed earlier a standard height solder joint would be in shear and cause creep to occur in the solder alloy. This creep will eventually cause the solder joint to break. The solder column 730 eliminates such a problem. This situation where the SMP sits on the upper PCB surface is the most favorable at controlling cross talk since there is no gap between the SMP and the PC board.

Again with reference to FIG. 3 showing a top view of the interface board 10, it can be seen that the preferred embodiment has segregated its pads 16 such that the ground pads divide the input and output pads. In the preferred embodiment, the ground pads are contained within a shield plate 40. This metallic shield plate 40 as illustrated in FIG. 3 acts as an electromagnetic wave barrier between the input pads 161 and 162 and the output pads 165 and 166 located on the opposite side of the shield plate 40. FIG. 5 illustrates the shield plate 42 configuration on the second surface 28. As illustrated, the input pads 261 and 262 are segregated and separated from the output pads 265 and 266 by the shield 42. The ground pads 263 and 264 are connected to the shield 42. Again with reference to the perspective views of FIGS. 1 and 2, it can be appreciated how the shields 40 and 42 are configured on the surfaces 22 and 28 of the interface board 10. Ground pad castellations 381 and 382 provide the electrical connection between the shields 40 and 42. In addition, as is illustrated in the above referenced drawings, the preferred embodiment comprises ground shield feed throughs 44 that provide electrical connection between the shields. Such a shield configuration has proven to effectively reduce crosstalk between the input and output signals. Tests measuring signal interference effects have shown that the interface board comprising the electrical shield plate configuration as described provided improved crosstalk rejection when compared to surface mount packages 12 mounted without the stress relief interface PC board 10. For the specific devices tested, crosstalk rejection improved by about 49 dB to 52 dB amounting to approximately six percent (6%). It should be appreciated that this is a significant improvement when one considers that component parts would be rejected as failed when showing only a ½ dB crosstalk effect.

The embodiment presented is one used with SAW devices and is shown for illustrative purposes only. It is appreciated that various leadless chip carriers and leadless devices can benefit from the invention as disclosed and variations in specific configurations are anticipated. Tests have shown that the above described interface device 10 successfully prevents failure of the solder joints in leadless component configurations. By way of specific example, a test sample of surface mount packages were affixed directly to printed circuit boards and passed through a thermal cycle ranging from −30 C. to +70 C. All packages showed some joint failure. A similar test sample using the interface device 10 was passed through the same thermal cycle without any failures. As of this writing, surface mount packages affixed to printed circuit boards using the interface board 10 have been run through thermal cycles ranging from −55 C. to +125 C. with no measurable failures. The tests included the use of vaporized liquid nitrogen baths to bring test fixtures containing the SMP, interface board 10 and the printed circuit board to −55 C. The fixture was allowed to soak at that temperature for approximately one half hour. After the low temperature soak, the temperature was raised to approximately +125 C. over a period of about five minutes. The fixture was allowed to soak at this high temperature for approximately one half hour at which time the thermal cycle was repeated. The boards 10 were dynamically tested in this way and solder joints continuously monitored for electrical continuity for approximately five hundred thermal cycles. These test showed the interface boards to be a success.

As discussed, the preferred embodiment has used surface mount packages found more often in use with SAW devices and their forms described in detail to properly teach the invention. It will be readily apparent to those skilled in the art that various modifications may be made therein without departing from the spirit of the invention or from the scope of the following appended claims.

What is claimed is:

1. An interface device useful with leadless electrical connections of components having different coefficients of thermal expansion, the device comprising:

an interface board having a first surface and an opposing second surface, the first surface dimensioned to receive a surface mount package having electrical contact pads, the second surface dimensioned to be affixed to a printed circuit board, the interface board having a central portion and a plurality of arm-like peninsular sections extending from the center section, the arm-like sections having proximal ends integrally affixed to the center section and distal ends displaced from the center sections, the interface board having a coefficient of thermal expansion proximate to that of the printed circuit board;

first leadless contact means affixed to the first surface, the first contact means arranged to make contact with surface mount package pads;

second contact means affixed to the second surface, the second contact means arranged to cooperate with printed circuit board pads, the second contact means located on the peninsular sections distal ends, the first contact means displaced from the second contact means by a distance sufficient to allow for movement between the first and second contact means resulting from temperature effects; and means for electrical connection of the first and second contact means, the connection means integrally affixed to the interface board along a path from the first contact means to the second contact means, wherein the connection means penetrates the interface board for making electrical contact with the second contact means, the interface board containing the electrical connection means permitting flexure between the first and second connection means.

2. The device as recited in claim 1, wherein the interface board further comprises:

an input portion wherein the contact means are used for component input signals; and an output portion wherein the contact means are used for component output signals.

3. The device as recited in claim 2, further comprising a ground portion, the ground portion having means for electrically shielding the input portion from the output portion, the shielding means for reducing crosstalk effects between the input and output signals.

4. The device as recited in claim 3, wherein the shielding means comprises:
- a first shield plate affixed to the interface board first surface, the first shield plate substantially covering the first surface, the first shield plate having a portion of first contact means for use as a ground pad;
- a second shield plate affixed to the interface board second surface, the second shield plate substantially covering the second surface, the second shield plate having a portion of the second contact means for use as ground pads; and
- means for electrically connecting the first and second shield plates.

5. The device as recited in claim 1, wherein the interface board is made of a material having characteristically similar materials to a printed circuit board when placed between a surface mount package and the printed circuit board.

6. The device as recited in claim 5, wherein the interface board comprises a flame retardant fiberglass and resin bonded material.

7. The device as recited in claim 1, wherein the leadless contact means comprise solder tinned copper pads affixed to the interface surfaces.

8. An interface device useful in relieving solder joint stress in leadless surface mount packages affixed to printed circuit boards, the interface device comprising:
- an interface printed circuit board having a first surface and a second surface, the interface board having a characteristic coefficient of thermal expansion substantially equal to a printed circuit board to which it is electrically affixed, the interface board having a center section and a plurality of arm-like peninsular sections extending from the center section, the arm-like sections having their proximal ends integrally affixed to the center section and their distal ends formed for receiving a pad, the arm-like sections configured so as to provide a compliant movement between the proximal end distal ends from a force on the distal end within the plane of the interface board and radially from the board center section;
- first electrical contact pads affixed to the board first surface at the arm-like sections distal ends;
- second electrical contact pads affixed to the board second surface at the proximal ends of the arm-like sections, the first and second pad of each arm-like section forming a pad set; and
- conduction means within each pad set affixed between the first and second pad of the pad set, the connection means providing electrical contact between each pad of the set, the connection means integrally affixed to each corresponding arm-like section.

9. The interface device as recited in claim 8, wherein the interface printed circuit board further comprises:
- an input portion having the electrical contact pads dedicated to input signals;
- an output portion having the electrical contact pads dedicated to output signals; and
- a ground portion, the ground portion having means for electrically shielding the input portion from the output portion, the shielding means useful in reducing crosstalk effects between the input and output signals.

10. The interface device as recited in claim 9, wherein the shielding means comprises:
- a first metallic shield plate affixed to the interface board first surface, the first metallic shield plate covering a substantial portion of the first surface, a remaining portion dedicated for use by the input and output contact pads, the first shield plate having a portion of the first contact pads affixed to the first shield for use as ground pads;
- a second metallic shield plate affixed to the interface board second surface, the second metallic shield plate covering a substantial portion of the second surface, a remaining portion dedicated for use by the input and output contact pads; and
- means for electrically connecting the first metallic shield plate to the second metallic shield plate wherein the connecting of the plates provides an electromagnetic shield useful in reducing crosstalk between signals at the input and output pads.

11. The interface device as recited in claim 10, wherein the connecting means comprises electrically conductive vertical traces between the first and second metallic shield plates.

12. The interface device recited in claim 11, further comprising electrically conductive feed throughs vertically affixed between the first and second shield plates.

13. The device as recited in claim 9, wherein the interface printed circuit board comprises a flame retardant fiberglass and resin bonded material.

14. A surface mount package system useful in affixing a leadless component to a printed circuit board, the device comprising:
- a surface mount package having a central section comprising a plurality of ground pads, an input section comprising a plurality of input pads, an output section comprising a plurality of output pads, the input and output sections being separated by the ground section;
- an interface printed circuit board having a first surface and a second surface, the interface board having a characteristic coefficient of thermal expansion substantially equal to a printed circuit board to which it is electrically affixed, the interface board having a center section and a plurality of arm-like peninsular sections extending from the center section, the arm-like sections having their proximal ends integrally affixed to the center section and their distal ends positioned for receiving the surface mount package pads, the arm-like sections configured so as to provide a compliant movement between the proximal and distal ends, the movement resulting from a force on the distal end within the plane of the interface board and radially from the board center section, the force caused by thermal effects;
- first interface pads structurally affixed to the arm-like distal ends, each first interface pads electrically affixed to a corresponding input, output and ground surface mount package pad;
- second interface pads structurally affixed to the interface board second surface at the arm-like proximal end, the second interface pads positioned so as to be connected to corresponding input, output and ground pads of the printed circuit board to which the interface board is affixed, each of the plurality of first and second interface pads forming a plurality of interface pad sets; and
- electrical connection means affixed between each of the first and second pads, the connection means providing electrical contact between each pad cooperating with a surface mount package pad and a corresponding pad on the printed circuit board, the connection means integrally affixed to a corresponding arm-like section comprising the first and second pad set.

15. A method for providing stress relief to solder joints used for affixing leadless surface mount packages to printed circuit boards, the method comprising the steps of:

providing an interface printed circuit board having a first surface and an opposing second surface;

providing a plurality of first electrical contact pads;

aligning the first contact pads for receiving the contact pads of a surface mount package with which it is communicating;

affixing the first contact pads to the first surface;

providing second contact pads;

aligning the second contact pads for electrical contact with corresponding pads of a printed circuit board with which it is communicating;

affixing the second pads onto the second surface;

displacing the first contact pad from each corresponding second contact pad by a length of interface board sufficient for flexing during movement between the first and second pads, the movement being caused by environmental temperature changes and by differing thermal expansion between the surface mount package and the interface board;

electrically connecting the first and second pads; and forming arm-like sections extending from a center portion of the interface board by removing board material on both sides of a path between the first contact pad and the second contact pad, the displacement between the first and second pads in combination with the removing of board materials providing stress relief to the solder joints.

16. The method as recited in claim 15, further comprising the steps of:

providing input, output and ground sections for the interface board;

selecting contact pads for use as groups of input, output and ground pads;

separating the input and output pad groups by the ground pad group; and providing an electrical shield as part of the ground section, the shield reducing crosstalk between input and output signals.

17. The method as recited in claim 15, further comprising the step of providing an interface board having a characteristic thermal coefficient of expansion equal to the printed circuit board to which the interface board is cooperating.

18. A method for reducing leadless component failure due to stress and creep within solder joints of the component, the method comprising the steps of:

providing a surface mount package for receiving the leadless electrical component, the package having a plurality of contact pads;

providing an interface printed circuit board having a first surface and an opposing second surface;

providing a plurality of first electrical contact pads;

aligning the first contact pads for receiving the contact pads of the surface mount package;

affixing the first contact pads to the first surface;

providing second contact pads;

aligning the second contact pads for electrical contact with corresponding pads of a printed circuit board with which it is communicating;

affixing the second pads onto the second surface;

displacing the first contact pad from each corresponding second contact pad by a length of interface board sufficient for flexing during movement between the first and second pads, the movement being caused by environmental temperature changes and by differing thermal expansion between the surface mount package and the interface board;

electrically connecting the first and second pads; and forming arm-like sections extending from a center area of the board by removing board material on both sides of a path between the first contact pad and the second contact pad, the displacement between the first and second pads in combination with the removing of board material providing stress relief to the solder joints.

19. The method as recited in claim 18, further comprising steps for reducing crosstalk between leadless component input and output, the steps comprising:

providing input, output and ground sections for the interface board;

selecting contact pads for use as groups of input, output and ground pads;

separating the input and output pad groups by the ground pad group; and providing an electrical shield as part of the ground section, the shield acting to reduce crosstalk between input and output signals.

* * * * *